(12) United States Patent
Anderson et al.

(10) Patent No.: US 8,686,721 B2
(45) Date of Patent: Apr. 1, 2014

(54) AUTOMATED PRE-PROCESSING OF BODY-MOUNTED MAGNETOMETER DATA FROM CONSTELLATIONS OF LOW EARTH ORBIT SATELLITES FOR DERIVATION OF BIRKELAND CURRENT SIGNATURES

(75) Inventors: Brian J. Anderson, Mt. Airy, MD (US); Lars P. Dyrud, Crownsville, MD (US); Jonathan T. Fentzke, Crownsville, MD (US); Robin J. Barnes, Elkridge, MD (US)

(73) Assignee: The Johns Hopkins University, Baltimore, MD (US)

( * ) Notice: Subject to any disclaimer, the term of this patent is extended or adjusted under 35 U.S.C. 154(b) by 174 days.

(21) Appl. No.: 13/450,851

(22) Filed: Apr. 19, 2012

(65) Prior Publication Data

US 2013/0221951 A1 Aug. 29, 2013

Related U.S. Application Data

(60) Provisional application No. 61/603,423, filed on Feb. 27, 2012.

(51) Int. Cl.
*G01R 33/02* (2006.01)

(52) U.S. Cl.
USPC .............................................. 324/244; 702/2

(58) Field of Classification Search
USPC ................................. 324/244; 702/2; 244/166
See application file for complete search history.

(56) References Cited

U.S. PATENT DOCUMENTS

| | | | |
|---|---|---|---|
| 4,883,244 | A | 11/1989 | Challoner et al. |
| 6,990,427 | B2 | 1/2006 | Kirsch et al. |
| 7,103,480 | B2 | 9/2006 | Intriligator et al. |
| 7,502,689 | B2 | 3/2009 | Jakowski et al. |
| 7,587,277 | B1 | 9/2009 | Wells |
| 8,065,074 | B1 | 11/2011 | Liccardo |
| 2006/0229813 | A1 | 10/2006 | Tobiska |
| 2010/0312513 | A1 | 12/2010 | Mayor et al. |

FOREIGN PATENT DOCUMENTS

GB 2350596 6/2000

*Primary Examiner* — Jay Patidar
(74) *Attorney, Agent, or Firm* — Noah J. Hayward (57) ABSTRACT

A system, method and computer-readable medium for mapping magnetic activity for a current linking a planet's space environment to an ionosphere of the planet are disclosed. Magnetic field measurements of the current are obtained from a plurality of satellites orbiting the planet. A residual magnetic field is determined from the obtained magnetic field measurements. The determined residual magnetic field is arranged to create a time series for a selected location of a planet-centered coordinate system. The magnetic activity is mapped using the created time series for the selected location.

20 Claims, 9 Drawing Sheets

AUTOMATED PRE-PROCESSING OF BODY-MOUNTED MAGNETOMETER DATA FROM CONSTELLATIONS OF LOW EARTH ORBIT SATELLITES FOR DERIVATION OF BIRKELAND CURRENT SIGNATURES

STATEMENT OF GOVERNMENTAL INTEREST

This invention was made with U.S. Government support under the National Science Foundation under contract number 0739864. The U.S. Government has certain rights in the invention.

CROSS-REFERENCE TO RELATED APPLICATIONS

This application is related to prior filed U.S. provisional application No. 61/603,423, filed on Feb. 27, 2012 which is incorporated herein by reference in its entirety.

BACKGROUND OF THE INVENTION

1. Field of the Invention

The present disclosure relates to methods of detecting magnetic signals produced by electrical currents flowing between Earth's atmosphere/ionosphere and space for the purpose of determining a distribution and intensity of the electrical currents. The present disclosure specifically relates to a system for obtaining time series of residual magnetic field measurements distributed globally over the Earth from a plurality of Earth-orbiting satellites.

2. Description of the Related Art

Geomagnetic storms generally related to solar activity generate currents, electric and magnetic fields in the upper atmosphere of the Earth and can have effects on various operations on Earth and its space environment. Exemplary disruptions include disruptions to high-frequency communications, global positioning systems, pagers, and electrical power grids. The electric current systems associated with these atmospheric effects generate magnetic fields which can be detected from a low Earth orbit. Global maps of these upper atmospheric magnetic signals recorded continuously over an extended period of time may allow for the derivation and monitoring of these currents and their dynamics in order to prepare for and respond to such disruptive activity. Therefore, the present disclosure provides a method and system for providing a global map of residual magnetic field signals above the ionosphere to provide global monitoring capabilities.

SUMMARY OF THE INVENTION

In one aspect, the present disclosure provides a method of mapping magnetic activity for a current linking a planet's space environment to an ionosphere of the planet, the method including: obtaining magnetic field measurements of the current from a plurality of satellites orbiting the planet; determining a residual magnetic field from the obtained magnetic field measurements; and arranging the determined residual magnetic field to create a time series for a selected location of a planet-centered coordinate system that maps the magnetic activity.

In another aspect, the present disclosure provides a system for mapping magnetic activity in an upper atmosphere of a planetary object, the system including: a plurality of magnetometers configured to orbit the planetary object, wherein at least one of the plurality of magnetometers is configured to measure a magnetic field of the planetary object along an orbital path of the at least one magnetometer; and a processor configured to: receive the magnetic field measurement from the at least one magnetometer, determine a residual magnetic field over a plurality of time segments for the magnetometer from the magnetic field measurement, and arrange the plurality of residual magnetic fields to obtain a time series of residual magnetic field data for a selected location of the planetary object to map the magnetic activity.

In yet another aspect, the present disclosure provides a computer-readable medium having instructions stored therein which when accessed by a processor enable the processor to perform a method, the method including: receiving magnetic field measurements obtained from a plurality of satellites orbiting the Earth in at least one orbital plane; determining a residual magnetic field from the obtained magnetic field measurements; arranging the determined residual magnetic field to create a record of residual magnetic fields over the at least one orbital plane; and determining at least one map of magnetic activity in an atmosphere of the Earth using the record of residual magnetic fields over the at least one orbital plane.

DETAILED DESCRIPTION

The present disclosure is directed to a system and method for determining a current between the Earth-space environment and its ionosphere/atmosphere using magnetic field measurements. The method uses measurements of magnetic fields obtained from a plurality of polar-orbit satellites orbiting the Earth. In one aspect, the magnetic field measurements from the plurality of satellites are collected at a central processing station and merged to form a plurality of raw-data time series, wherein each first time series includes a time series of magnetic field measurements obtained for a selected satellite. The time series measurements can be compared to a model of an Earth magnetic field, which can be a standard model, to determine residual magnetic fields ($\delta B$), which are departures from a main model field, at the satellites. The residual magnetic fields can then be rearranged to obtain a second time series, wherein a selected second time series corresponds to a residual magnetic field. The second time series is used to provide a global map over the Earth by collecting data over a given time span over the tracks of the satellites such that the slots in each orbit plane provide a continuous sampling over each orbit plane. The second time series can be stored to a computer-readable medium or used to perform an operation in various scientific and industrial applications. In one aspect, the second time series can be used to determine the currents between the Earth-space environment and the atmosphere, e.g. Birkeland currents, in a real-time basis. Dynamics in the mapped residual magnetic fields reflect corresponding dynamics in the field-aligned currents or Birkeland currents flowing in and out of the Earth's ionosphere whose spatial and time development can then be determined.

More particularly, the present disclosure includes the methods for deriving magnetic field signatures of said currents from a plurality of low Earth orbiting satellites in near-polar orbits. The satellites send the data to a central processing station, typically an Earth-based location, using one or more data packets. The data packets generally provide location and attitude information as well as magnetic measurements obtained via multi-component magnetometers associated with the satellites. A processor at the central processing station collects, time-stamps and arranges the plurality of packets to obtain an array that includes a plurality of first time series related to magnetic field measurements. Each of the plurality of first time series corresponds to a selected satellite. An exemplary first time series can include magnetometer data, vehicle position and vehicle attitude data, etc.

At least one of the first time series, and generally all of the first time series, are compared to an Earth magnetic field model, and a residual magnetic field data vector is obtained from a difference between the obtained magnetometer data and the Earth magnetic field model. In various embodiments, the Earth magnetic field model is a time-varying model such as the International Geomagnetic Reference Field (IGRF) model, which is a standard mathematical description of the Earth's magnetic field. Comparing the Earth magnetic field model to the magnetometer data typically includes rotating the Earth magnetic field model from an Earth frame of reference into a coordinate system of the satellite using satellite attitude and position data sent from the satellite to the central processing station.

Determining the residual magnetic field further includes correcting magnetometer data using at least one of a gain, orientation and orthogonality corrections which are specific to for each magnetometer and satellite. These corrections are generally derived and applied using magnetometer measurements obtained over a 24-hour period and are made prior to determining the preliminary residual magnetic field for a selected satellite.

The preliminary residual magnetic field provides a basis to evaluate the appropriate frequency band over which attitude data are used. A low-pass filter is used to remove spurious high-frequency noise from the attitude data. The suitable pass frequency for this filter is selected by performing the filtering operation over a range of pass frequencies and evaluating the stability of the filtered magnetic field residuals with respect to pass frequency. A stable residual magnetic field varies less than 10% per factor of 2 difference in the pass filter frequency. In various embodiments, the selected pass frequency is about $\frac{2}{3}$ of an orbit.

The residual attitude data filtered at the selected pass frequency are then used to derive final magnetic residuals which are transformed into geophysically meaningful coordinate system, such as an Earth-centered inertial (ECI) coordinates.

Various methods may then be used to determine a quality of the final magnetic residual data. In one embodiment, data quality factors (DQ) are determined for each residual magnetic fields time segments. In general, the data quality factor is defined as a standard deviation of magnetic field residuals for a specific satellite and time segment divided by a mean standard deviation in the magnetic field residual for the same time segment from the plurality of satellites. Data having DQ values outside of a selected threshold are discarded. In various embodiments, a residual magnetic field segment having a data quality factor DQ>1.3 is discarded. Discarded data segments are replaced with residual magnetic field data derived from neighboring or nearby satellites in the orbit plane of the satellite whose data were discarded.

The time series of final magnetic field residuals from the plurality of satellites are then merged into records for specified time intervals, wherein the duration of the specified time intervals corresponds to at least a time between sequential satellites in a given orbit plane. The resulting merged records can represent continuously sampled final magnetic residuals over an entire orbital plane and correspond to a global sample of the magnetic signatures recorded over the time span of the record. The time step between each global magnetic field residual record is generally shorter than the time span represented by each record, and is typically one quarter to one tenth of the time span represented by each record. The sequence of global magnetic field residual records represents a time series of magnetic signatures over the Earth. The series of global magnetic residual records may be stored to a computer-readable medium and/or accessed by various operators for evaluating the residual data to determine the dynamics of Birkeland currents and/or remotely sense other currents that may be indicated by the magnetic residuals.

Figure 1:
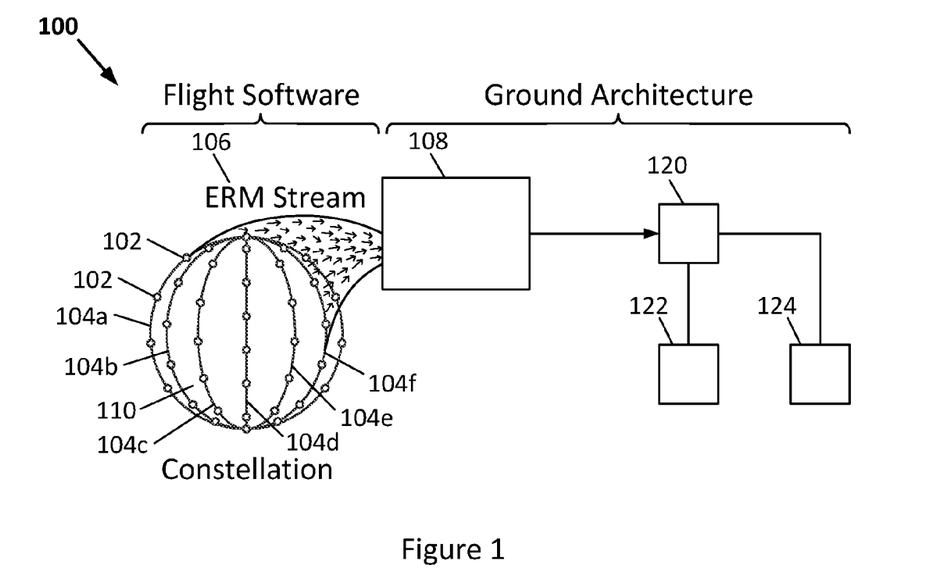
FIG. 1 shows an exemplary orbital system that can be used in various aspects of the present disclosure to provide magnetic field measurements to a central location in one embodiment of the disclosure.

FIG. 1 shows an exemplary orbital system 100 that can be used in various aspects of the present disclosure to provide magnetic field measurements to a central location in one embodiment of the disclosure. The orbital system 100 includes a plurality of satellites 102 orbiting a planetary body 110 such as the earth. In an exemplary embodiment, the plurality of satellites 102 include low earth orbiting (LEO) satellites such as used in the Iridium constellation of satellites which includes 66 LEO polar orbit satellites. Each satellite of the exemplary Iridium constellation travels along a polar orbit in one of six polar planes 104a-104f. Each orbital plane includes 11 satellites. The Iridium satellites generally orbit at an altitude of approximately 780 kilometers at an orbital inclination of approximately 86 degrees from the equator. An orbital period for a selected satellite is approximately 100 minutes. Therefore, for a selected point in the orbital path, a satellite passes the selected point approximately every 9 minutes. It should be noted that the Iridium constellation is only an exemplary embodiment and the parameters of the Iridium constellation are not meant as a limitation of the present disclosure. The number of satellites, number of orbital planes, number of satellites per orbital plane, orbital inclination, satellite altitude and velocity, etc., can have other values in alternate embodiments. In addition, although the present disclosure is discussed with respect to Earth, one skilled in the art would recognize that the present disclosure is applicable to any planetary body having a magnetic field.

Data is sent from each satellite 102 to a central processing station 108, which in one exemplary embodiment is the Satellite Network Operations Center (SNOC) facility. The data is sent in packets called Event Response Messages (ERMs) 106 that typically contain tri-axial magnetic field measurement data, position data, and a plurality of attitude data which can include attitude sample data and interpolated attitude data derived from the attitude sample data, as well as other data that may be suitable for derivation of magnetic signals due to natural phenomena. In addition, various exemplary engineering flags, such as torque rod operation and attitude control mode, can be sent within the ERM or in alternate data telemetry streams. The ERM includes data obtained over a selected time segment. In an exemplary embodiment, an ERM includes 74 magnetic field values sampled at evenly spaced times. In an exemplary embodiment, the time spacing between magnetic field samples is 19.4 seconds or 2.2 seconds, corresponding to ERM time spans of 24 minutes or 3 minutes, respectively.

The ERM packets and other ancillary data are catalogued at the central processing station 108 and reformatted/packaged for electronic transmission to a central processing location 120 according to individual satellite and compiled to form a first time series corresponding to the satellite. In one embodiment of the system, the central processing location 120 is the Science Data Center (SDC) operated by and residing at The Johns Hopkins University Applied Physics Laboratory. The exemplary time series is composed of data from multiple ERM packets into one-hour files for each satellite. The central processing station 108 generally performs the methods disclosed herein for determining a time series of final residual magnetic field for each satellite and merges the individual time series of final magnetic field residuals to derive a series of global magnetic residual records. Additionally, the central processing station 108 can send the determined time series and global magnetic residual records to a memory device 120, a display 122 and a user 124 having an interest in the data.

Figure 2:
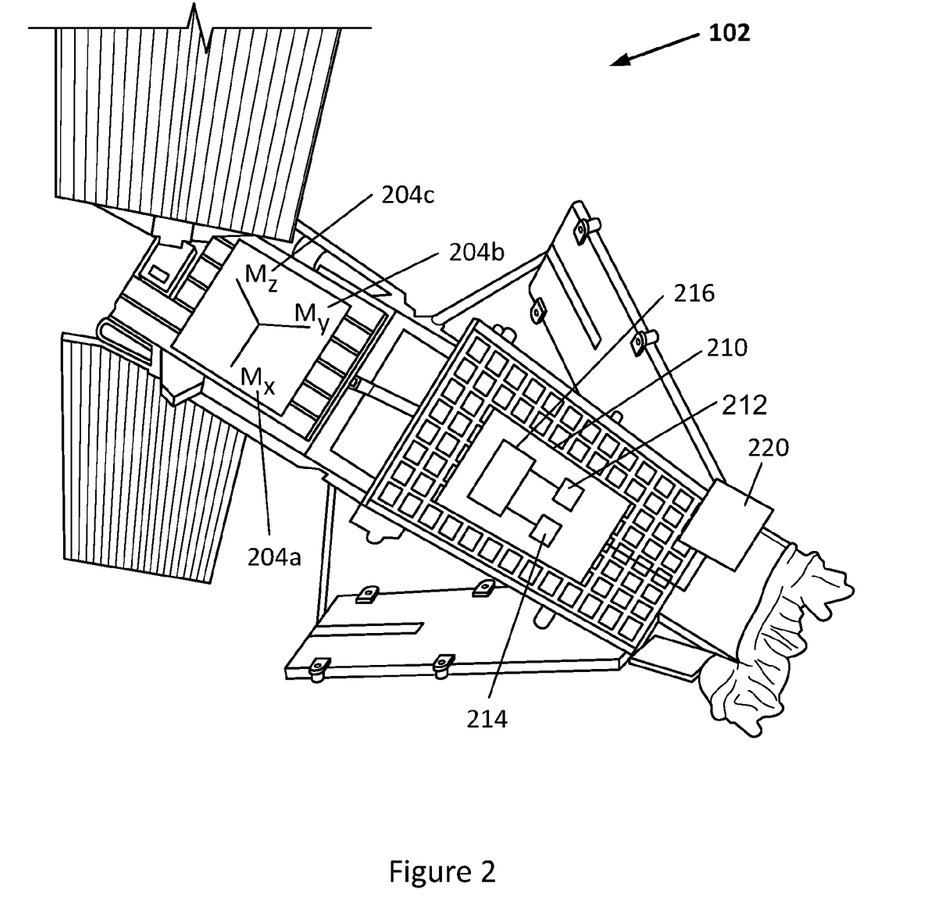
FIG. 2 shows a view of an exemplary satellite used with the exemplary system of FIG. 1.

FIG. 2 shows a detailed view of an exemplary satellite 102 of the present disclosure suitable for use with the exemplary system of FIG. 1. The exemplary satellite includes at least a power source, which can include, for example, a storage battery and/or solar panels. The satellite 102 may include a satellite processing unit 210 configured to perform various operations of the satellite for providing data to the central processing station 108 of FIG. 1. The satellite processing unit 210 includes various programs 212 for providing instruction to a processor 216 enabling the processor to perform various functions including data collection and data transmittal. The satellite processing unit also includes a memory 214 that includes a database that may contain data that can be used by the processor 216 running the programs 212 to perform various operations of the satellite, for example, to obtain magnetometer measurements. The memory 214 can also be used to store various magnetometer measurements and related data obtained at the satellite used in the methods disclosed herein. The exemplary satellite includes a communication unit 220 coupled to the satellite processing unit 210 and configured to transmit and receive data from the central processing station 108. In addition, the satellite 102 includes a magnetometer 204 sensitive to magnetic field lines encountered by the satellite as its traverses its orbital path. In the exemplary implementation the magnetometer 204 is mounted on the body of the satellite and processor 216 removes any contamination signals present due to satellite operations. The magnetometer 204 includes three magnetometer components $M_x$ (204a), $M_y$ (240b), and $M_z$ (204c) aligned substantially along orthogonal directions. The magnetic field measurement of a selected magnetometer is affected by various operating parameters of the magnetometer, such as magnetometer gain, orientation, orthogonality conditions, etc. The reference frame of the magnetometer may be the same or different from the reference frame of its corresponding satellite. Calculations can be performed to transform measurements obtained in the magnetometer reference frame to the satellite reference frame. Measurements obtained at the magnetometer 204 are sent to the satellite processing unit 210 and transmitted via ERM to the central processing station 108 of FIG. 1.

Figure 3:
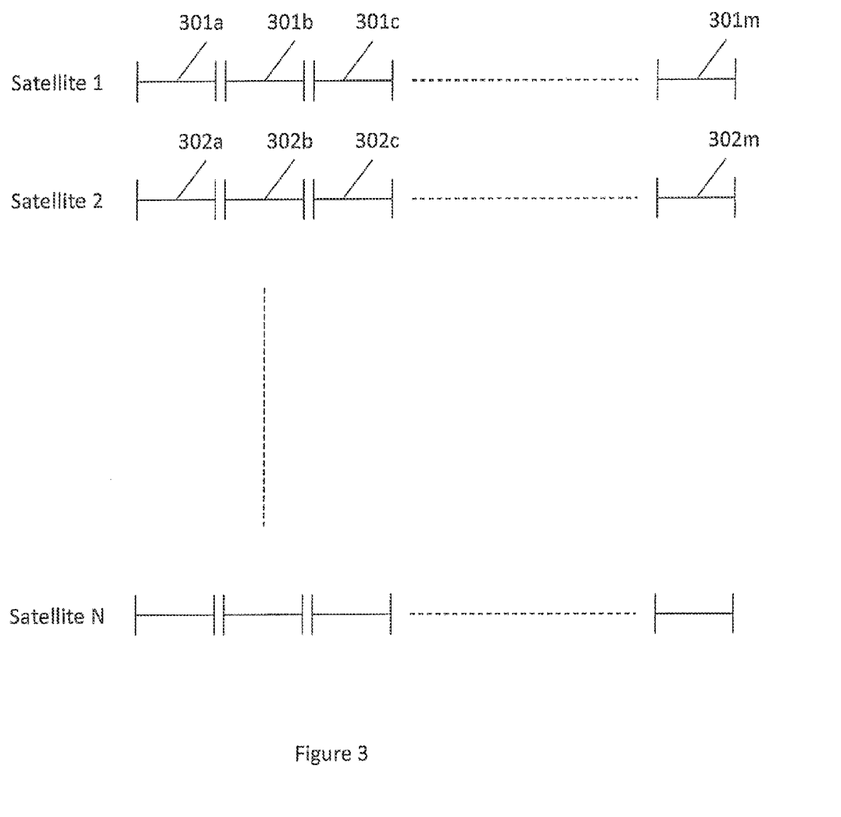
FIG. 3 shows an exemplary array of raw magnetometer time series related to the exemplary satellites.

FIG. 3 schematically illustrates an exemplary array of first time series that include raw magnetometer data obtained at the plurality of satellites of FIG. 1. The raw magnetometer data arriving at the central processing station 108 are catalogued and packaged for transmission to the data center 120, time-stamped, and arranged into a plurality of time series $Sat_1$-$Sat_N$, wherein each time series includes a chronological arrangement of time-segments of magnetometer measurements obtained from a selected satellite. For example, the time series for $Sat_1$ includes magnetometer data segments 301a-301m obtained at a first satellite. Similarly, the time series for $Sat_2$ includes magnetometer data segments 302a-302m obtained at a second satellite. With respect to the exemplary first satellite, data segment 301a is obtained prior to data segment 301b, which is obtained prior to data segment 301c, etc. Each data segment (301a-301m) of magnetometer data corresponding to each ERM in the exemplary implementation has a selected time duration corresponding to the number of samples in each data packet. The time series assembled from the raw data packets can be of any selected time duration and are typically selected to have durations of either one hour or one day.

Time series for each satellite can also be made for satellite information such as attitude data, position data, etc. The attitude time series is generally formed using a selected method of interpolation, because the number of attitude measurements per packet is generally less than the number of magnetometer measurements per packet. In an exemplary embodiment, attitude measurements are obtained about 7 times per ERM, while magnetometer measurements are obtained about 74 times per ERM. The interpolation generally provides attitude data to correspond to each magnetometer measurement. In one embodiment, the obtained attitude data can be interpolated using a piece-wise cubic spline fit.

The raw magnetometer data of the satellite-centered time series ($Sat_1$-$Sat_N$) are corrected for various errors (i.e., for calibration, gain, attitude, interpolation errors, etc.). An exemplary correction includes calibrating data from each satellite with a physical model of the Earth's magnetic field. The calibration provides consistency in measurements between all satellites. In an exemplary embodiment, the magnetometers are calibrated to the IGRF model. In one embodiment, the inter-satellite calibration is conducted over a 24-hour time span of magnetometer data obtained over the plurality of satellites. The satellite calibration can include deriving a correction matrix C that determines a vector correction and a constant c that determines a scalar correction. The calibration includes performing multiple linear regression fits of 24 hours of magnetometer data obtained from each satellite. The correction matrix and correction constant can be derived by fitting the original residuals to linear functions of the IGRF field. That is C and c are determined by minimizing:

$$\Delta^2 = \Sigma[(B_{body,i} - B_{IGRbody}) - (C \cdot B_{IGRbody} + c)]^2 \qquad \text{Eq. (1)}$$

where $B_{body,i}$ refers to a magnetic field measurement vector obtained in the $i^{th}$ satellite body frame of reference, and $B_{IGRFbody}$ is the model field as rotated into the spacecraft body frame at the position of the measurement and the sum is over the 24-hour period. Once the correction matrix and scalar correction is derived for the 24-hour period for a selected satellite data, the correction (i.e., matrix C and scalar correction c) is applied to the magnetometer data over the same 24 hour period, using Eq. (2) to derive corrected initial magnetic residuals:

$$\delta B_{body\_correct,i} = B_{body,i} - B_{IGRbody} - C \cdot B_{IGRbody} - c \qquad \text{Eq. (2)}$$

The resulting corrected magnetometer time series $\delta B_{body\_correct,i}$ is therefore corrected for scalar gain, offset, and orientation errors, and results in data from the plurality of satellites being normalized to the same effective DC level.

Once calibration errors are removed, the corrected magnetometer time series measurements are used to determine a selected processing for interpolated attitude data to derive final magnetic residuals. In various embodiments, the initial residual magnetic fields are calculated as a difference between the corrected magnetometer measurements and the related model field (IGRF) rotated into the body frame of the satellite. Since, rotating the model field into the body frame of the satellite is affected by errors in attitude data and the values of the residual magnetic fields are sensitive to errors in attitude data. A 1° error in attitude can result in an error in the residual magnetic field of nearly 1000 nT, which is larger than typical magnetic signatures from field-aligned currents in the upper atmosphere and is nearly as strong as the largest magnetic field perturbations due to magnetic storms, flares, etc. Thus, in various embodiments, a low-pass filter is applied to the interpolated attitude data to derive of magnetic residuals that has a reduced correlation between the filtered magnetic residuals and the attitude data.

Figure 4A:
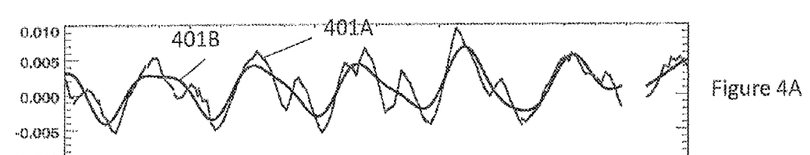
FIGS. 4A-4C shows exemplary x, y, and z components of attitude for a selected satellite.
Figure 4B:
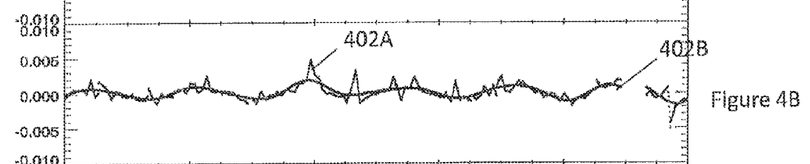
Figure 4C:
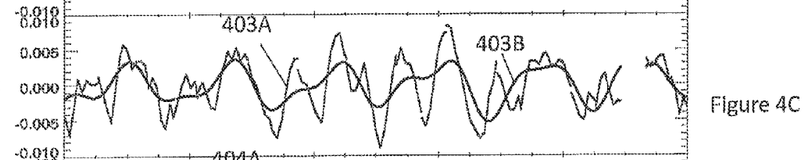

FIGS. 4A-4C shows x, y, and z components respectively of attitude data for a selected satellite. Time is shown along the abscissa in hours. Attitude is shown along the ordinate. Curve 401A indicates original x-component attitude data. Curve 402A indicates interpolated and filtered x-component attitude data obtained from the data of curve 401A. Similarly curves 401B and 401C show raw y-component and z-component attitude data respectively. Curves 402B and 402C shows interpolated attitude data along the y-component and z-component, respectively.

Figure 4D:
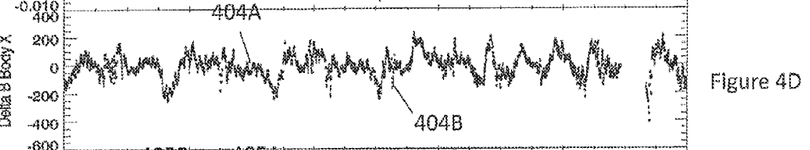
FIGS. 4D-4F shows exemplary x, y, and z components of residual magnetic field data.
Figure 4E:
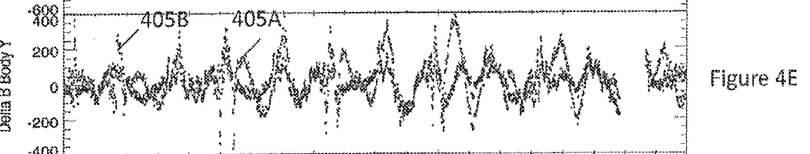
Figure 4F:
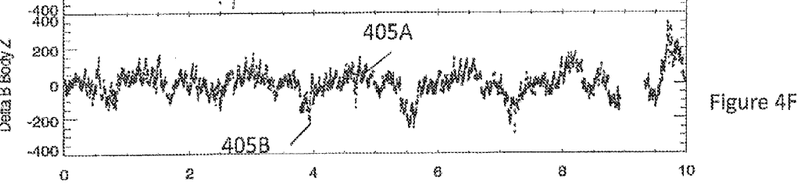

FIGS. 4D-4F shows the x, y, and z components of residual magnetic field data. Curve 401D shows the x-component of residual magnetic field data ($\delta B_x$) obtained by using the original attitude data (i.e., curve 401A) to rotate the model field into the satellite body frame of reference. Curve 402D shows the x-component of residual magnetic field data obtained using interpolated and filtered attitude data to rotate the model field into the satellite body frame of reference. Similarly, curve 401E shows the y-component of residual magnetic field data ($\delta B_y$) obtained by using the original attitude to rotate the model field into the satellite body frame of reference, and curve 402E shows the residual magnetic field obtained using interpolated and filtered attitude data. Curve 401F shows the y-component of residual magnetic field data ($\delta B_y$) obtained by using the original attitude to rotate the model field into the satellite body frame of reference, and curve 402F shows the residual magnetic field obtained using interpolated and filtered attitude data.

Figure 5:
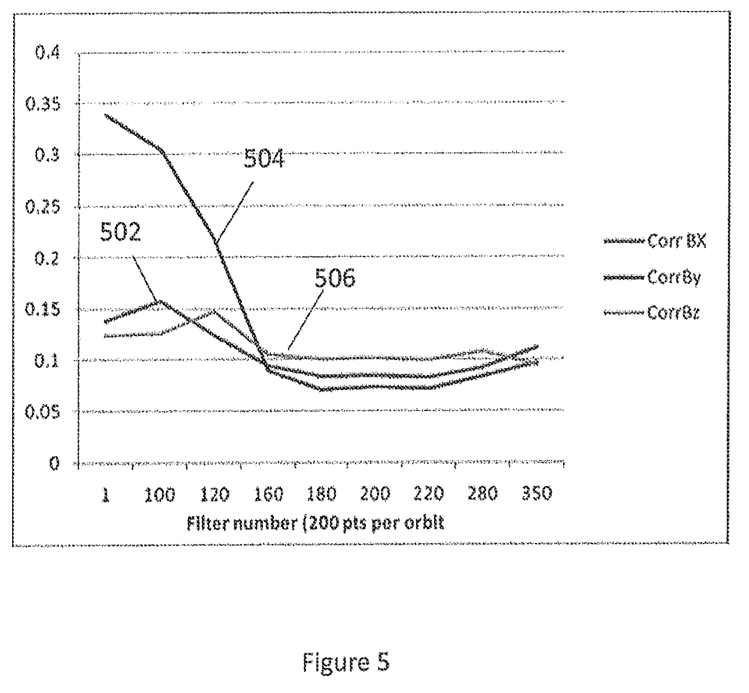
FIG. 5 shows the effects of pass filter frequency on a correlation coefficient between residual magnetic field and attitude.
Figure 6:
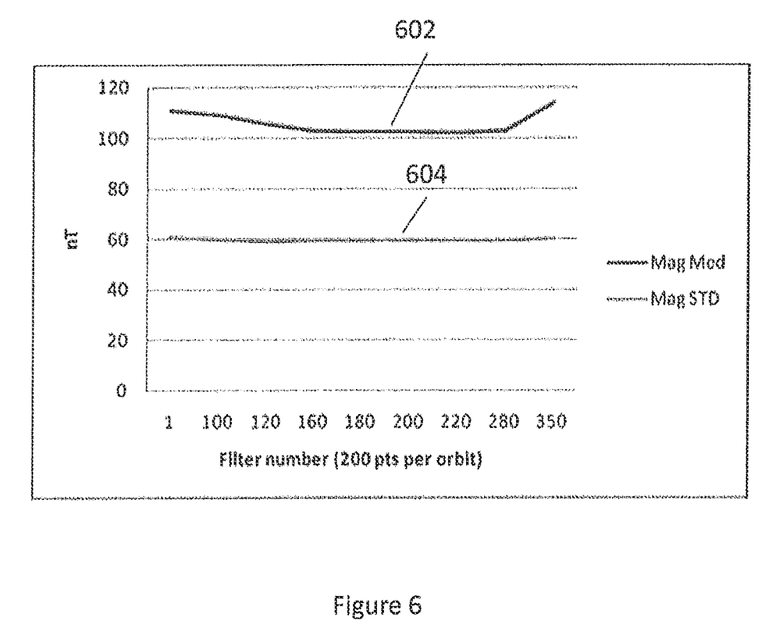
FIG. 6 shows exemplary residual magnetic field values obtained at various filter pass frequencies.

FIG. 5 shows the effect of the attitude low-pass filter frequency on the correlation coefficient between residual magnetic field and attitude. The abscissa shows a filter number which is proportional to the filter low-pass frequency applied to the attitude data, wherein a filter number of 200 corresponds to a complete orbit of a satellite. The correlation coefficient is shown along the ordinate axis. Correlation coefficients are shown for $\delta B_x$ (502), $\delta B_y$ (504) and $\delta B_z$ (506). As the filter frequency increases, the correlation coefficients decrease to substantially stable values, most notably for $\delta B_y$ (504). The correlation coefficient begins to plateau at a filter number of about 160, indicating a low-pass frequency of about ⅔ of an orbit. Thus, in an exemplary embodiment, a filter having a pass frequency of about ⅔ of an orbit is selected to produce a filtered residual magnetic field. FIG. 6 shows exemplary residual magnetic field values obtained at various filter pass frequencies. The median magnetic field 602 is at a substantial minimum for a filter number between 160 and about 280. The standard deviation 604 of the residual magnetic field is substantially constant over this pass filter region indicating a stable residual magnetic field value.

The filtered residual magnetic field data is then checked for quality. In an exemplary embodiment, the data quality factor can be determined using Eq. (3) below:

$$DQ_{Sat} = \frac{\text{median}(\Delta B)}{\text{mean}(\text{median}(\Delta B))_{constellation}} \qquad \text{Eq. (3)}$$

wherein $\Delta B$ is a standard deviation of the residuals, $DQ_{Sat}$ is a data quality factor for a residual magnetic field for selected data packet from a satellite, median($\Delta B$) is a median residual magnetic field standard deviation for the selected satellite, and mean(median($\Delta B$))$_{constellation}$ is an average of the median standard deviations of residual magnetic field obtained over the plurality of satellites. Generally, when the $DQ_{Sat}$ for a selected data packet is outside a selected quality level, the corresponding residual magnetic field is considered of poor quality. In an exemplary embodiment, $DQ_{Sat}>1.3$ indicates poor quality residual magnetic field. Once identified, the poor quality residual magnetic field is discarded and replaced. In general, the residual magnetic field that replaces the discarded field may be residual magnetic field measurements from either a satellite preceding the satellite that produces the poor field, a satellite following the satellite producing the poor field, or a combination of the preceding satellite and the following satellite. In various embodiments, replacement residual magnetic field can be selected using an associated data quality factor. In one embodiment, the replacement residual magnetic field is an average of the nearest available neighbors weighted by a reciprocal of a time difference between the replacement field and the discarded field. In various embodiments, the replacement field can be identified to an operator by color coding or other data visualization method.

Figure 7:
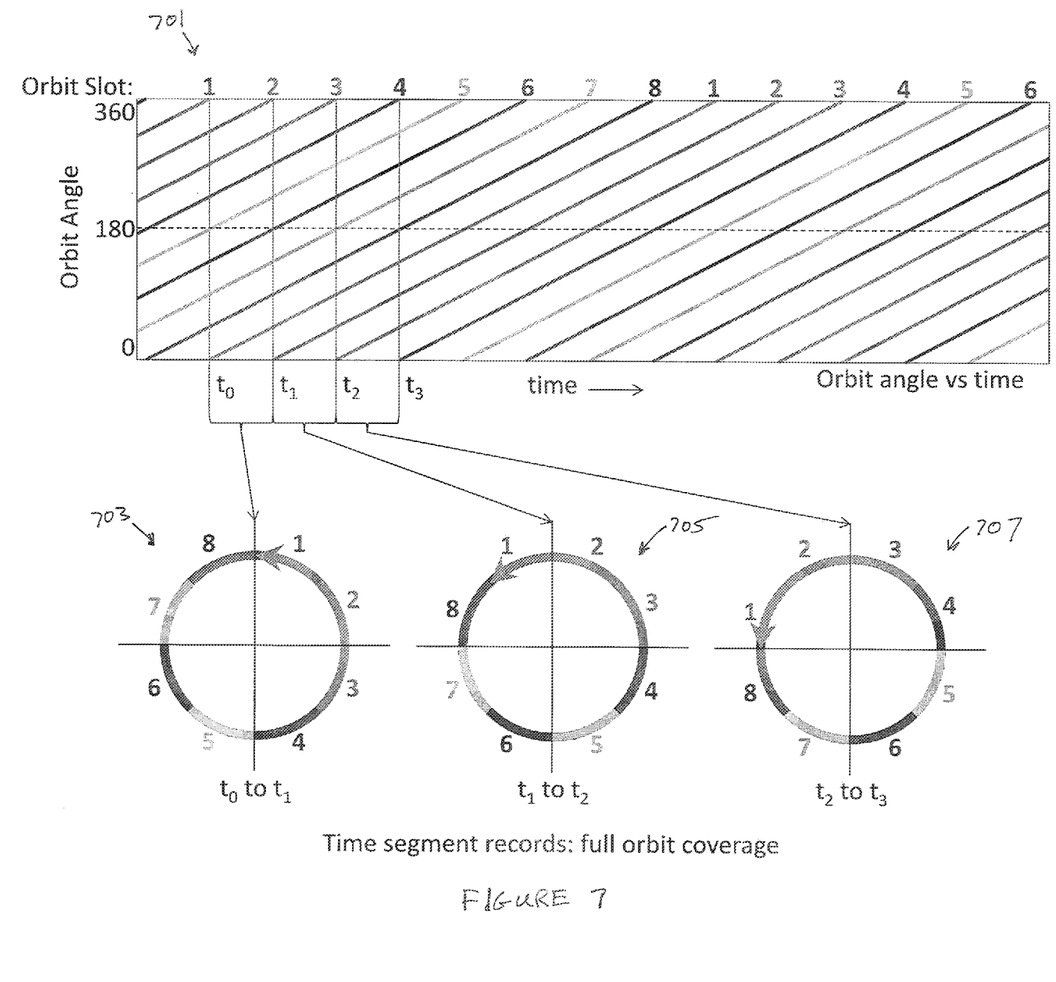
FIG. 7 illustrates assembly of a sampled record for a selected orbital plane from a time series of residual magnetic fields.

FIG. 7 illustrates how the individual time series are assembled into full-orbit sampled records for a single orbital plane. This process is repeated for each orbital plane. FIG. 7 shows an exemplary time series 701 of satellite orbit latitude (orbital angle) versus time for an exemplary embodiment that includes eight orbits. All eight satellites are in a same orbital plane and follow substantially the same orbital path, as seen in an inertial coordinate frame of reference, with satellite 1 ahead of satellite 2, which is ahead of satellite 3, and so on. Satellite 1 flies through orbit angle 0 at time $t_0$, while Satellite 2 flies through orbit angle 0 at time $t_1$, etc. Collecting data from the satellites in the orbit plane from time $t_0$ to time $t_1$ gives a composite orbit angle coverage, as shown in the panel 703. Similarly, the satellite coverage from time $t_1$ to time $t_2$ is shown in panel 705 and satellite coverage from time $t_2$ to time $t_3$ is shown in panel 707. In this manner, data records consisting of the time segments of all satellites in each orbit plane provide a full-orbit data record that spanning the entire globe.

Figure 8:
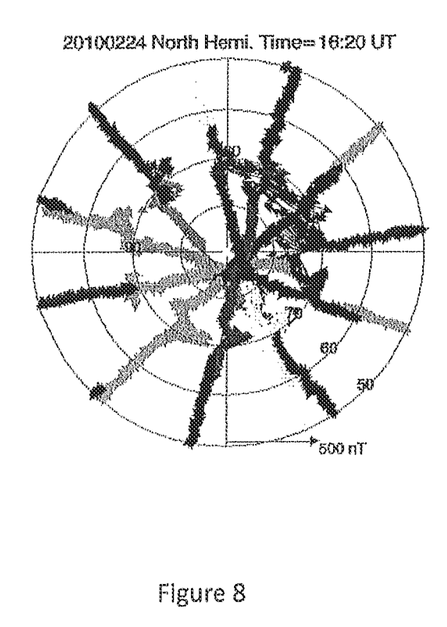
FIG. 8 shows an exemplary plot survey of residual magnetic fields at various locations on the earth obtained using the methods disclosed herein.

FIG. 8 shows a survey plot of residual magnetic field data obtained at various locations over the Earth poleward of 50 degrees latitude using the methods disclosed herein. The plot indicates the distribution of magnetic perturbations above Earth's ionosphere due to Birkeland currents and series of these records allow assessment of the development and distribution of these currents and their concomitant effects. In an exemplary embodiment of the present disclosure, the data record displays survey may be supplied to an operator in real-time. An operator can use the plot survey to perform any number of operations. In one example, an electrical company can use the output data to prepare an electrical grid for upper atmospheric electromagnetic activity such as may be caused for example by a solar flare. In another example, an operator can use the output data to discern upper atmospheric activity affecting atmospheric drag acting on space debris activity. An atmospheric scientist can use the mapped residual magnetic field data to determine the production of Birkeland currents as well as to identify regions and intensity of thermospheric heating. The operator can also identify regions and intensities of strong ionospheric electric field responsible for generating ionospheric density irregularities responsible for GPS navigation disruptions, high frequency communications disruptions, radar clutter, etc. Of course, there are several other uses for the plot survey not disclosed herein but which are nonetheless considered within the scope of the present disclosure.

Figure 9:
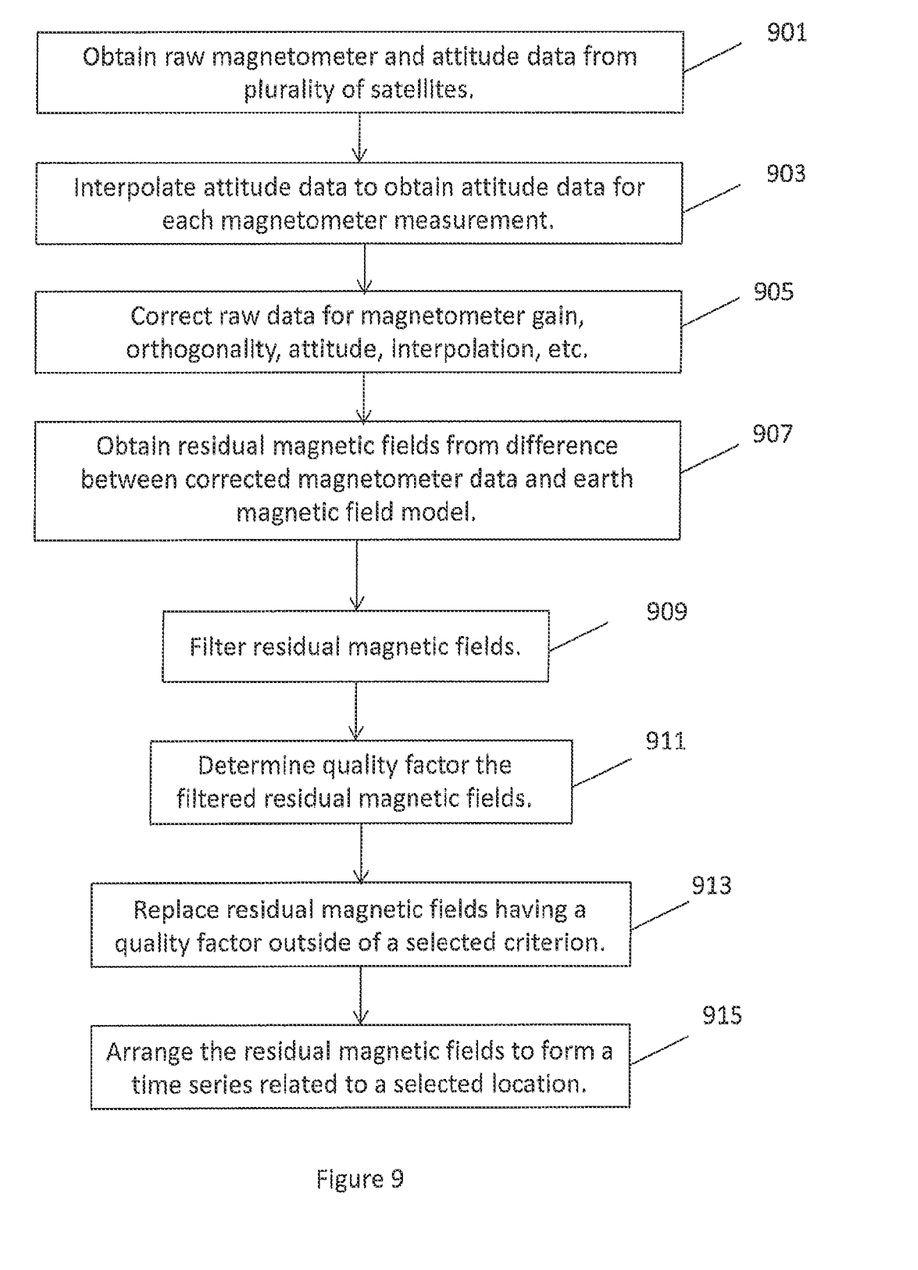
FIG. 9 shows a flowchart of an exemplary method of the present disclosure for obtaining a time series of residual magnetic fields at a selected location.

FIG. 9 shows a flowchart of an exemplary method of the present disclosure for obtaining a series of global records of residual magnetic fields. In Box 901, raw magnetometer and attitude data is obtained at a plurality of satellites and collated at a central processing station to form a plurality of first time series for the raw magnetometer data, wherein each of the plurality of time series corresponding to a satellite. In Box 903, the attitude data is interpolated to obtain attitude data corresponding to each of the raw magnetometer data. In Box 905, the raw magnetometer data is corrected for various error parameters, such as magnetometer gain, magnetometer orthogonality error, magnetometer orientation or attitude, data interpolation error, etc. This step of Box 903 includes the determination of a low-pass frequency for use in processing of the attitude data that reduces errors due to high-frequency noise in the attitude data. In Box 907, residual magnetic fields are obtained from a difference between the corrected time series from Box 905 and a model of the earth's magnetic field, which in various embodiments, is the IGRF model of the earth's magnetic field. In Box 909, a filter is applied to the residual magnetic field to obtain a stable value for the residual magnetic field. In Box 911, a data quality factor is determined for the filtered residual magnetic fields. In Box 913, residual magnetic fields that have data quality factor outside of a selected quality criterion are replaced with replacement segment of residual fields. In Box 915, the residual magnetic field segments are arranged to produce a second time series of residual magnetic fields, wherein a second time series corresponds to a selected location in an earth-centered inertial reference frame.

Therefore, in one aspect, the present disclosure provides a method of mapping magnetic activity for a current linking a planet's space environment to an ionosphere of the planet, the method including: obtaining magnetic field measurements of the current from a plurality of satellites orbiting the planet; determining a residual magnetic field from the obtained magnetic field measurements; and arranging the determined residual magnetic field to create a time series for a selected location of a planet-centered coordinate system that maps the magnetic activity. In an embodiment in which the planet is Earth, the plurality of satellites further includes low Earth orbit satellites having polar orbits. The residual magnetic fields are determined from a difference between the obtained magnetic field measurement and a planetary magnetic field model. A model of the planet's magnetic field is rotated into a reference frame of at least one of the plurality of satellites in order to determine the residual magnetic field. In one embodiment, attitude data associated with the residual magnetic field is filtered at a filter frequency that is selected to eliminate attitude noise. The method may further include the steps of (i) applying orientation, gain and offset corrections to obtained magnetic field measurements at at least one satellite; (ii) transforming a planetary magnetic field model into a body frame of reference of the at least one satellite and subtracting the transformed planetary magnetic field model from the obtained magnetic field measurements to obtain a magnetic residual vector in the body frame of reference of the at least one satellite; and (iii) transforming the magnetic residual vector into a frame of reference of the planet. A quality factor may be evaluated for the plurality of residual magnetic fields. When the evaluated quality factor of the residual magnetic field meets a selected quality threshold, the residual magnetic field may be removed from a selected slot, and replaced with a generated residual magnetic field. The generated residual magnetic field may be generated from at least one of: (i) a residual magnetic field from a satellite in an adjacent slot ahead of the selected slot along the orbital path; and (ii) a residual magnetic field from a satellite in a slot behind the selected slot along the orbital path. An ionospheric disturbance can then be determined from the mapped magnetic activity. Determining the current linking the planet's space environment to the ionosphere of the planet generally uses the created time series of the residual magnetic field for the selected location of the planetary-centered coordinate system.

In another aspect, the present disclosure provides a system for mapping magnetic activity in an upper atmosphere of a planetary object, the system including: a plurality of magnetometers configured to orbit the planetary object, wherein at least one of the plurality of magnetometers is configured to measure a magnetic field of the planetary object along an orbital path of the at least one magnetometer; and a processor configured to: receive the magnetic field measurement from the at least one magnetometer, determine a residual magnetic field over a plurality of time segments for the magnetometer from the magnetic field measurement, and arrange the plurality of residual magnetic fields to obtain a time series of residual magnetic field data for a selected location of the planetary object to map the magnetic activity. In an embodiment in which the planet is Earth, the plurality of magnetometers is located on a plurality of low Earth orbit satellites. The processor is may be configured to determine the residual magnetic field from a difference between the obtained magnetic field measurement and a magnetic field model of the planetary object. The processor may be further configured to rotate the magnetic field model of the planetary object into a reference frame of the magnetometer. The processor may be further configured to filter attitude data of at least one of the plurality of magnetometers and select a filter to apply to the attitude data to reduce noise. In one embodiment, the processor is configured to: (i) evaluate a quality factor for the plurality of residual magnetic fields; (ii) remove a residual magnetic field for a selected slot when the quality factor for the residual magnetic field meets a selected quality threshold; and (iii) replace the removed residual magnetic field with a generated residual magnetic field. The processor can replace the removed residual magnetic field using at least one of: (i) a residual magnetic field from a satellite in an adjacent slot ahead of the selected slot along the orbital path; and (ii) a residual magnetic field from a satellite in a slot behind the selected slot along the orbital path. In one embodiment, the processor is determines an atmospheric event from the determined magnetic activity. The system may further include an interface enabling an operator to determine an action using the mapped magnetic activity. In an embodiment in which the planet is Earth, the processor may determine a current linking an Earth-space environment to the atmosphere of the Earth using the created time series of the residual magnetic field for a selected location in an Earth-centered coordinate system.

In yet another aspect, the present disclosure provides a computer-readable medium having instructions stored therein which when accessed by a processor enable the processor to perform a method, the method including: receiving magnetic field measurements obtained from a plurality of satellites orbiting the Earth in at least one orbital plane; determining a residual magnetic field from the obtained magnetic field measurements; arranging the determined residual magnetic field to create a record of residual magnetic fields over the at least one orbital plane; and determining at least one map of magnetic activity in an atmosphere of the Earth using the record of residual magnetic fields over the at least one orbital plane.

While the foregoing disclosure is directed to the exemplary embodiments of the disclosure, various modifications will be apparent to those skilled in the art. It is intended that all variations within the scope and spirit of the appended claims be embraced by the foregoing disclosure.

What is claimed is:

1. A method of mapping magnetic activity for a current linking a planet's space environment to an ionosphere of the planet, comprising:
   obtaining magnetic field measurements of the current from a plurality of satellites orbiting the planet;
   determining a residual magnetic field from the obtained magnetic field measurements; and
   arranging the determined residual magnetic field to create a time series for a selected location of a planet-centered coordinate system that maps the magnetic activity.

2. The method of claim 1, wherein the planet is Earth and the plurality of satellites are low Earth orbit satellites having polar orbits.

3. The method of claim 1, wherein the determining the residual magnetic field comprises determining a difference between the obtained magnetic field measurement and a planetary magnetic field model.

4. The method of claim 1, wherein the determining the residual magnetic field further comprises rotating a model of the planet's magnetic field into a reference frame of at least one of the plurality of satellites.

5. The method of claim 1, further comprising filtering attitude data associated with the residual magnetic field at a filter frequency selected to eliminate attitude noise.

6. The method of claim 1 further comprising:
   (i) applying orientation, gain and offset corrections to obtained magnetic field measurements at at least one satellite;
   (ii) transforming a planetary magnetic field model into a body frame of reference of the at least one satellite and subtracting the transformed planetary magnetic field model from the obtained magnetic field measurements to obtain a magnetic residual vector in the body frame of reference of the at least one satellite; and
   (iii) transforming the magnetic residual vector into a frame of reference of the planet.

7. The method of claim 1, further comprising:
   (i) evaluating a quality factor for the plurality of residual magnetic fields;
   (ii) removing a residual magnetic field for a selected slot when the quality factor of the residual magnetic field meets a selected quality threshold; and
   (iii) replacing the removed residual magnetic field with a generated residual magnetic field,
      wherein the generated residual magnetic field is generated from at least one of:
         (i) a residual magnetic field from a satellite in an adjacent slot ahead of the selected slot along the orbital path; and
         (ii) (ii) a residual magnetic field from a satellite in a slot behind the selected slot along the orbital path.

8. The method of claim 1, further comprising determining an ionospheric disturbance from the mapped magnetic activity.

9. The method of claim 1, further comprising determining the current linking the planet's space environment to the ionosphere of the planet using the created time series of the residual magnetic field for a selected location of the planetary-centered coordinate system.

10. A system for mapping magnetic activity in an upper atmosphere of a planetary object, comprising:
    a plurality of magnetometers configured to orbit the planetary object, wherein at least one magnetometer of the plurality of magnetometers is configured to measure a magnetic field of the planetary object along an orbital path of the at least one magnetometer; and
    a processor configured to:
       receive the magnetic field measurement from the at least one magnetometer, determine a residual magnetic field over a plurality of time segments for the magnetometer from the magnetic field measurement, and
       arrange the plurality of residual magnetic fields to obtain a time series of residual magnetic field data for a selected location of the planetary object to map the magnetic activity.

11. The system of claim 10, wherein the planet is Earth and the plurality of magnetometers are located on a plurality of low Earth orbit satellites.

12. The system of claim 10, wherein the processor is further configured to determine the residual magnetic field from a difference between the obtained magnetic field measurement and a magnetic field model of the planetary object.

13. The system of claim 12, wherein the processor is further configured to rotate the magnetic field model of the planetary object into a reference frame of the magnetometer.

14. The system of claim 10, wherein the processor is further configured to filter attitude data of at least one of the plurality of magnetometers and select a filter to apply to the attitude data to reduce noise.

15. The system of claim 10, wherein the processor is further configured to:
    (i) evaluate a quality factor for the plurality of residual magnetic fields;
    (ii) remove a residual magnetic field for a selected slot when the quality factor for the residual magnetic field meets a selected quality threshold; and
    (iii) replace the removed residual magnetic field with a generated residual magnetic field.

16. The system of claim 15, wherein the processor is further configured to replace the removed residual magnetic field using at least one of: (i) a residual magnetic field from a satellite in an adjacent slot ahead of the selected slot along the orbital path; and (ii) a residual magnetic field from a satellite in a slot behind the selected slot along the orbital path.

17. The system of claim 10, wherein the processor is further configured to determine an atmospheric event from the determined magnetic activity.

18. The system of claim 10, further comprising an interface enabling an operator to determine an action using the mapped magnetic activity.

19. The method of claim 10, wherein the planet is Earth and the processor is further configured to determine a current linking an Earth-space environment to the atmosphere of the Earth using the created time series of the residual magnetic field for a selected location in an Earth-centered coordinate system.

20. A non-transitory computer-readable medium product having instructions stored therein which when accessed by a processor enable the processor to perform a method, the method comprising:

receiving magnetic field measurements obtained from a plurality of satellites orbiting the Earth in at least one orbital plane;

determining a residual magnetic field from the obtained magnetic field measurements;

arranging the determined residual magnetic field to create a record of residual magnetic fields over the at least one orbital plane; and determining at least one map of magnetic activity in an atmosphere of the Earth using the record of residual magnetic fields over the at least one orbital plane.

* * * * *